(12) United States Patent
Gehrt

(10) Patent No.: US 6,255,905 B1
(45) Date of Patent: Jul. 3, 2001

(54) ACTIVE FILTER CIRCUIT HAVING A T-NETWORK INPUT ARRANGEMENT THAT PROVIDES A HIGH INPUT IMPEDANCE

(75) Inventor: Holger Gehrt, Rosengarten (DE)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/374,693

(22) Filed: Aug. 16, 1999

(30) Foreign Application Priority Data

Aug. 19, 1998 (DE) .............................................. 198 37 574

(51) Int. Cl.⁷ ...................................................... H03F 1/36
(52) U.S. Cl. ............................ 330/107; 330/109; 330/69; 330/303
(58) Field of Search .............................. 330/69, 107, 109, 330/303; 327/552

(56) References Cited

U.S. PATENT DOCUMENTS

| | | | |
|---|---|---|---|
| 3,571,761 | * 3/1971 | Meek | 330/303 |
| 3,715,680 | * 2/1973 | Fleischer | 330/109 |
| 4,509,019 | 4/1985 | Banu et al. | 330/107 |
| 4,780,690 | 10/1988 | Voorman | 330/294 |
| 5,049,831 | * 9/1991 | Westwick | 330/107 |

OTHER PUBLICATIONS

Holt Electronic Circuits Digital & Analog, John Wiley & Sons New York 1978 p. 778.*

* cited by examiner

Primary Examiner—Michael B. Shingleton
(74) Attorney, Agent, or Firm—John Vodopia

(57) ABSTRACT

A filter circuit is provided that provides an input impedance arrangement with a high impedance value, which can be fabricated on a semiconductor body with a high accuracy and with a minimal semiconductor area being required. The input impedance arrangement comprises at least one T network having at least three impedance branches, of which a first impedance branch is connected to the filter input, a second impedance branch is connected to the amplifier input and a third impedance branch is connected to a circuit point for draining a current from the filter input.

10 Claims, 2 Drawing Sheets

ACTIVE FILTER CIRCUIT HAVING A T-NETWORK INPUT ARRANGEMENT THAT PROVIDES A HIGH INPUT IMPEDANCE

BACKGROUND OF THE INVENTION

1. Field of the Invention

The invention relates to a An active electronic filter circuit, comprising at least one filter input, at least one amplifier element having at least one amplifier input and for at least one of the filter inputs and at least one of the amplifier inputs a network which defines the filter characteristic and which comprises an input impedance arrangement for connecting the filter input to the amplifier input.

2. Description of Related Art

From U.S. Pat. No. 4,509,019 a tunable high-pass or low-pass filter is known, which filter includes a push-pull amplifier having electronically controllable elements in either the two input branches or the two feedback branches (or both in the input branches and the feedback branches). Each of the other branches includes a reactance element. This arrangement serves to attain a low distortion, which allows a simple integration on a semiconductor body using a non-linear element, for example a MOS transistor, as voltage-controlled element.

It has been found that this known filter circuit has the drawback that the time constant attainable with such a filter circuit is only adjustable over a comparatively small control range because the resistance values of the MOS transistors used as controllable elements can be varied only over a comparatively small control range.

From U.S. Pat. No. 4,780,690 a filter arrangement is known whose time constant should be adjustable over a comparatively large range. This filter arrangement comprises a push-pull amplifier having an inverting input, a non-inverting input, an inverting output, a non-inverting output, a first input terminal and a second input terminal, a first feedback circuit including a first capacitor and arranged between the non-inverting output and the inverting input, and a second feedback circuit including a second capacitor substantially identical to the first capacitor and arranged between the inverting output and the non-inverting input. This known filter arrangement further comprises a transconductance circuit with variable transconductance, which has two inputs connected to the input terminals of the filter arrangement, as well as two outputs respectively connected to the inverting input and the non-inverting input of the amplifier. The transconductance circuit is a voltage-controlled current source which converts a balanced input voltage into a balanced output current. The transconductance dictates the proportionality factor between the output current and the input voltage. Generally, this transconductance can be varied over a comparatively large range, as a result of which the time constant of the known filter arrangement should also be variable over a comparatively large range.

The transconductance circuit of the filter arrangement in accordance with U.S. Pat. No. 4,780,690 includes several active elements which each have a control input and a first and a second input terminal. The control inputs of at least two of said active elements are connected to the input terminals of said filter arrangement. The first output terminals of said at least two active elements are connected directly to one another and the second output terminals of these two active elements are connected to said inverting amplifier input and said non-inverting amplifier input, respectively.

The filter arrangement known from U.S. Pat. No. 4,780,690 further comprises a load circuit for loading the transconductance circuit. This load circuit comprises a first and a second current source transistor whose interconnected base electrodes are connected to a node between two resistors via a diode, which resistors are arranged between the outputs of the transconductance circuit.

From U.S. Pat. No. 4,780,690 it is further known to form a transconductance circuit by means of MOS transistors. This known transconductance circuit is also assumed to have a comparatively large linear voltage range.

BRIEF SUMMARY OF THE INVENTION it is an object of the invention to provide an active electronic filter arrangement including an input impedance arrangement having a high impedance, which arrangement can be fabricated on a semiconductor body with a high precision and on a small semiconductor area.

According to the invention, this object is achieved in an active electronic filter circuit of the type defined in the opening paragraph in that the input impedance arrangement comprises at least one T network having at least three impedance branches, of which a first impedance branch is connected to the filter input, a second impedance branch is connected to the amplifier input and a third impedance branch is connected to a circuit point for draining a current from the filter input.

The implementation of the input impedance arrangement by means of a T network results in an impedance branch via which a part of a signal current applied to the filter input or the filter inputs is passed around the associated amplifier input or the associated amplifier inputs. As a result of this, said part of the signal current is no longer available in the network which defines the filter characteristic and, as a consequence, the effective impedance acting at the filter input or the filter inputs increases accordingly. The circuit point for draining this current from the filter input or the filter inputs can be a common ground terminal of the circuit.

In an advantageous embodiment of the invention an active electronic filter circuit, having two filter inputs and one amplifier element having two amplifier inputs, is designed in such a manner that the input impedance arrangement comprises at least one T network having a first, a second, a third and a fourth impedance branch respectively connected to the first one and the second one of the filter inputs and the first and the second one of the amplifier inputs, and the first and the second impedance branch, on the one hand, are connected to the second and the fourth impedance branch and, on the other hand, via a fifth impedance branch.

Preferably, an active filter circuit of this type takes the form of a push-pull amplifier element. The part of the signal current which bypasses the amplifier inputs is routed from one of the filter inputs to the other filter input via the fifth impedance branch, as a result of which it is not necessary to have a separate circuit point to which this current is drained. Instead, one of the filter inputs serves as such a circuit point and in this embodiment the input impedance arrangement of the electronic filter circuit can preferentially be floating.

In a further embodiment of the active electronic filter circuit in accordance with the invention the input impedance arrangement comprises at least two T networks in cascade. Thus, the impedance value of the input impedance arrangement can be increased considerably by means of a minimal number of circuit elements.

In another embodiment of the invention the T network is or the T networks are symmetrical with respect to the filter inputs and/or the amplifier inputs. This symmetrical arrangement is particularly suitable in push-pull circuits.

In another variant of invention the impedance branches are essentially formed by means of ohmic elements; in particular, at least some of the impedance branches may include controllable essentially ohmic elements. Preferably, the controllable essentially ohmic elements are arranged symmetrically within each T network. The filter characteristic of the active electronic filter circuit in accordance with the invention can be defined advantageously and can be adjusted precisely by means of controllable essentially ohmic elements, which are preferably formed by means of MOS transistors. When MOS transistors are used this can be achieved in a manner known per se by means of control voltages.

In a preferred embodiment of an active electronic filter circuit in accordance with the invention the network which determines the filter characteristic takes the form of an integrating stage, in conjunction with the amplifier element. In such an integrating stage the input impedance arrangement is preferably purely ohmic.

Active electronic filter arrangements in accordance with the invention can be used advantageously in all electronic communication equipment because they facilitate the miniaturization of this equipment as a result of the fact that they can be integrated on a semiconductor body. At the same time, their filter characteristics can be adjusted with such a precision that a high signal processing quality can be achieved.

BRIEF DESCRIPTION OF THE DRAWINGS

The drawings, in which like elements bear the same reference symbols, shown an embodiment of the invention given by way of example. In the drawings.

DETAILED DESCRIPTION OF THE INVENTION

Figure 1:
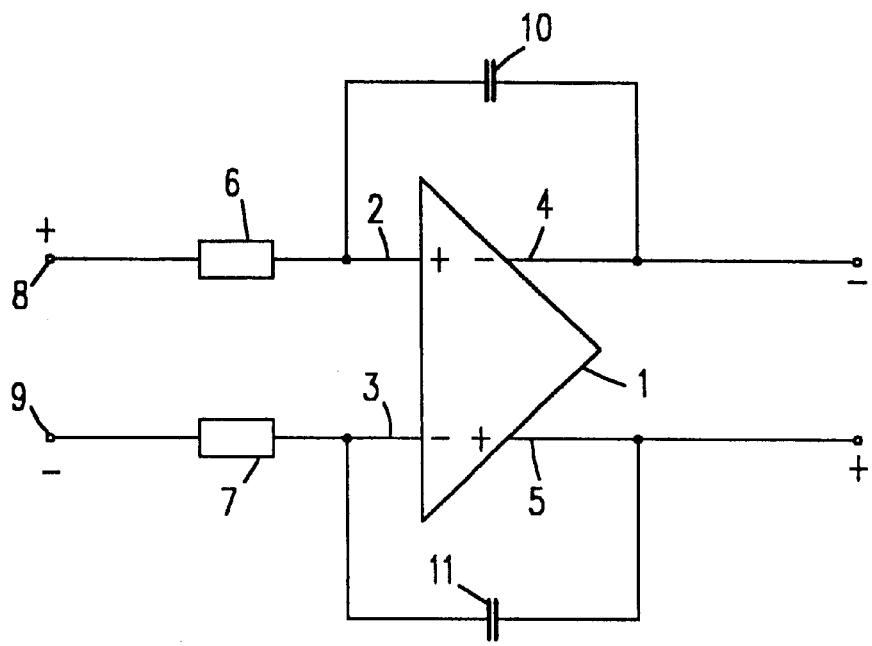
FIG. 1 shows a balanced integrator filter as an example of an active electronic filter circuit of a design derived from U.S. Pat. No. 4,509,019.

The present invention will be described with the aid of the example of a two-pole balanced integrator filter. FIG. 1 shows such an integrator filter. This integrator filter comprises an amplifier element 1 having a non-inverting amplifier input 2, an inverting amplifier input 3, an inverting amplifier output 4 and a non-inverting amplifier output 5. A network which determines the filter characteristic of the balanced integrator filter includes an input impedance arrangement comprising a first ohmic resistance 6 and second ohmic resistance 7. The first ohmic resistance 6 connects a first filter input 8 to the non-inverting amplifier input 2, and the second ohmic resistance 7 connects a second filter input 9 to the inverting amplifier input 3. The network which determines the filter characteristic of the balanced integrator filter includes further includes two capacitances, of which a first one baring the reference numeral 10 forms a feedback branch between the inverting amplifier output 4 and the non-inverting amplifier input 2, while the second capacitance 11 forms a feedback branch between the non-inverting amplifier input 5 and the inverting amplifier input 3. Moreover, the amplifier outputs 4, 5 form outputs of the balanced integrator filter shown in FIG. 1.

A push-pull amplifier as shown in FIG. 1 can be constructed with a high precision by means of controlled components and can, moreover, be integrated wholly on a semiconductor body. As controlled components, i.e. circuit elements whose characteristic data are controllable, it is preferred to use MOS transistors, by which the ohmic resistances 6, 7 can be formed. This is basically known from U.S. Pat. No. 4,509,019.

For dimensioning an active electronic filter circuit of this construction, for example a balanced integrator filter, the basic procedure is that a so-called prototype filter for the filter to be created is developed on the basis of the given specifications. This is translated into an ideal filter variant, in the present example an ideal variant of a balanced integrator filter, for which the circuit elements are assumed to be ideal. For this purpose, a level of values for the dimensioning of the values of the ohmic resistances and capacitances should be chosen. This choice is made in dependence on specifications for the filter circuit to be realized. Such specifications include, in particular, the signal-to-noise ratio and the current consumption of the filter circuit.

These specifications result in a suitable basic resistance, which can be used as the standard value for the ohmic resistances to be realized and, if appropriate, also for the capacitances to be realized. The characteristic data of the elements of the filter circuit to be implemented are then scaled with respect to this basic resistance.

Methods for the synthesis of active electronic filter circuits are basically known from the literature, for example from the monograph by R. Schaumann, M. S. Ghausi and K. R. Laker: "Design of Analog Filters", published by Prentice Hall, 1990.

In view of the desired accuracy in the dimensioning of such a filter circuit it is attempted to choose for all the elements of this circuit values which at least substantially correspond to said basic resistance. However, this is not always possible depending on the filter type to be realized and the given specifications. For the dimensioning of the individual elements there are often large deviations from the values dictated by the basic resistance. It may then be attempted to generate these deviating values by a parallel or series arrangement of elements dimensioned in accordance with the value of the basic resistance. If, for example, elements having high ohmic resistance values are required, this is achieved by a series arrangement of individual ohmic resistance elements each having a resistance value which is in accordance with the basic resistance.

Figure 2:
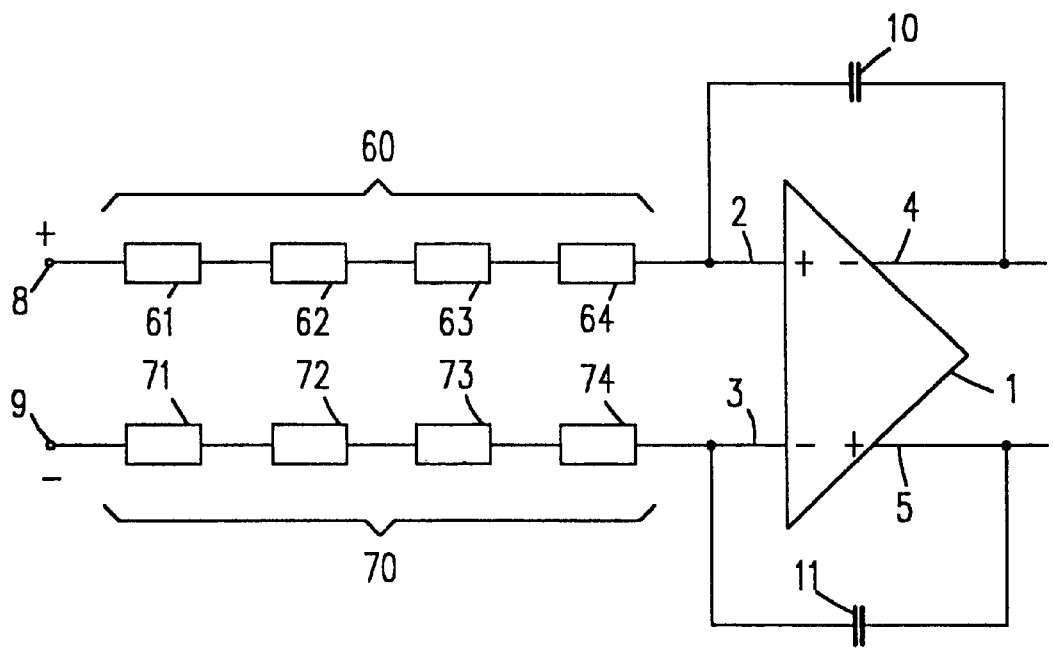
FIG. 2 shows a variant of the filter circuit shown in FIG. 1.

An example of a balanced integrator filter thus designed is shown in FIG. 2. For its filter characteristic a high input resistance is required. In order to achieve this, the input impedance arrangement in the present example comprises as first ohmic resistance 60 and as second ohmic resistance 70 a series arrangement of four resistance elements 61, 62, 63, 64 and 71, 72, 73, 74, respectively, which each have the standard value of the basic resistance. Thus, the first ohmic resistance 60 and the second ohmic resistance 70 in the example shown in FIG. 2 each have four times the resistance value of a resistance element 61, 62, 63, 64, 71, 72, 73 or 74. Thus, four times as many circuit elements are required in order to make the input resistance four times as high.

This implementation method is very complex owing to the large number of circuit elements, which increases in proportion to the desired resistance value in the input impedance arrangement. Moreover, as the number of circuit elements increases the number of parasitic capacitances which occur in these elements increases likewise, particularly if the resistance elements take the form of MOS transistors. Such parasitic capacitances have a very adverse effect on the desired filter characteristic, particularly in the range of the higher frequencies. Therefore, it is desirable to aim at a design of the input impedance arrangement which enables high resistance values to be realized by means of a comparatively small number of resistance elements.

Figure 3:
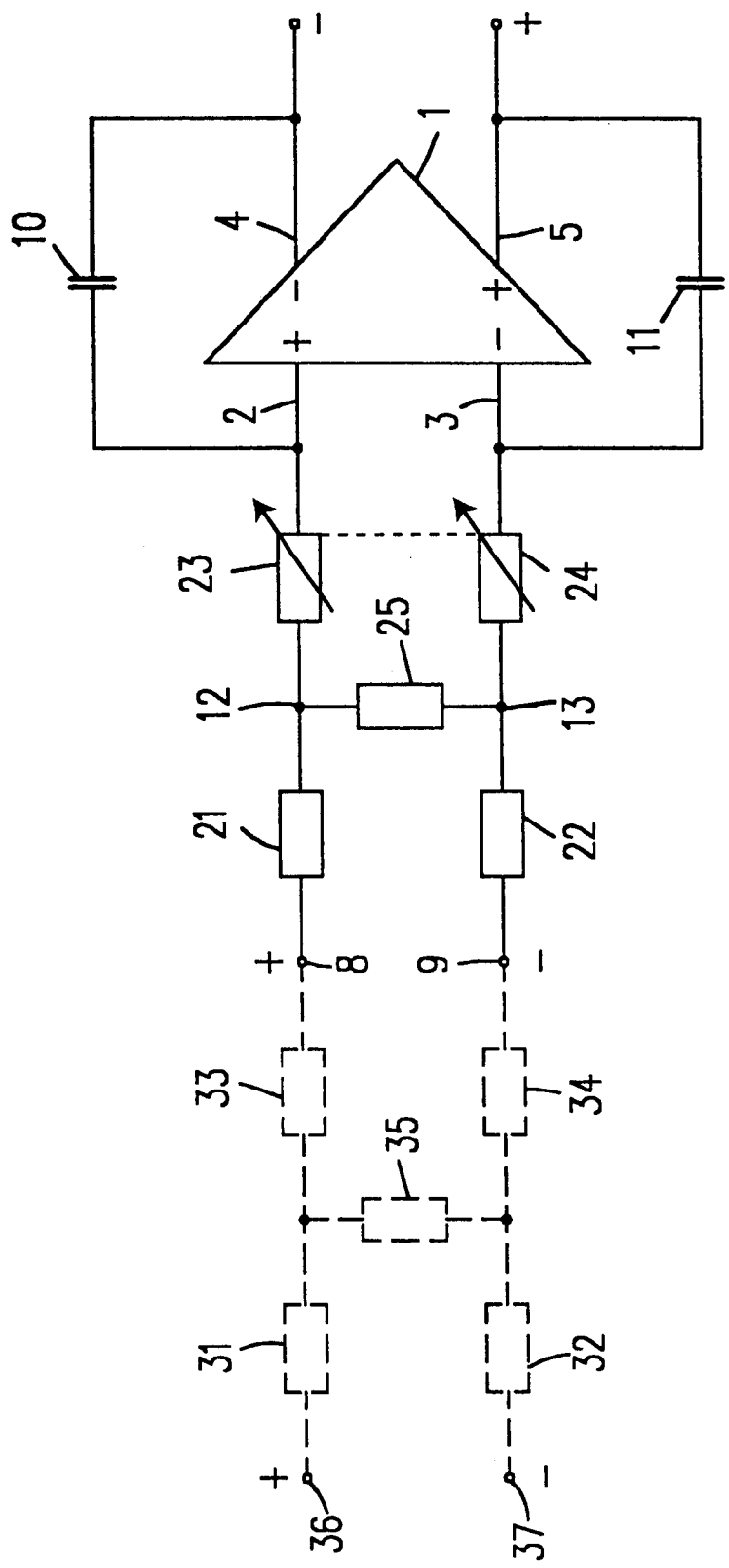
FIG. 3 shows a balanced integrator filter as an example of an active electronic filter circuit in accordance with the invention.

FIG. 3 shows an example of how this problem is solved in accordance with the invention. The structure of the input impedance arrangement used in this filter circuit is founded on the basic idea to pass the currents applied to the filter inputs 8, 9 around the amplifier inputs 2, 3 involved in defining the filter characteristic. This is achieved in that in the present example the input impedance arrangement comprises a T network having five impedance branches. A first one of these impedance branches, referenced 21, has one end connected to the first filter input 8 and has another end connected to a first node 12. A second one of the impedance branches, referenced 22, is arranged between this first node 12 and the non-inverting (first) amplifier input 2. Likewise, a third one of these impedance branches, referenced 23, is arranged between the second filter input 9 and a second node 13, which is connected to the inverting (second) amplifier input 3 via a fourth one of the impedance branches, referenced 24. A fifth one of the impedance branches, referenced 25, is arranged between the two nodes 12 and 13.

The input impedance arrangement thus formed has a T structure which ensures that a part of a signal current which flows via the filter inputs 8, 9 bypasses the virtual zero point of the amplifier element 1. As a result, this part of the signal current is not available for charging or discharging the capacitances 10, 11 and the effective input resistance of the balanced integrator shown increases accordingly. For a filter circuit as shown in FIG. 1 or 2 the calculation of the effective value for the input resistance at the filter inputs 8 and 9 by means of a network analysis yields the value of the ohmic resistance 6, 7, 60, 70, i.e. for an arrangement as shown in FIG. 2 the sum of the resistance elements 61 to 64 or 71 to 74 in a branch between one of the filter inputs 8 or 9 and the amplifier 2 or connected thereto. For the filter circuit shown in FIG. 3 this effective input resistance Reff is calculated in accordance with the formula Reff=R21+R23+2*R21*R23/R25.

This equation is obtained assuming that all impedance branches 21 to 25 are formed by means of ohmic resistances and, in order to achieve a symmetrical structure of the filter circuit, the resistance values in the first and the second impedance branch 21, 22 are equal and the resistance values in the third and the fourth impedance branch 23, 24 are also equal.

If for example the resistance elements 61 t0 64 and 71 to 74 in FIG. 2 as well as the ohmic resistances forming the impedance branches 21 to 25 of the T network shown in FIG. 3 are dimensioned so as to have identical resistance values, the effective input resistances with respect to the filter inputs 8 and 9 in the filter circuits of FIGS. 2 and 3 are found to correspond. However, as compared with the circuit of FIG. 2, three resistance elements can be dispensed with in the embodiment of the invention shown in FIG. 3.

By a different choice of the resistance values for the impedance branches 21 to the input impedance arrangement shown in FIG. 3 can also be dimensioned so as to obtain other, particularly higher effective resistance values for the input resistance with respect to the filter inputs 8, 9. This has the advantage that it is then possible to dimension the impedance branches largely with the resistance value of the basic resistance or with small multiples thereof. For some dimensioning examples some of the impedance branches 21 to 25 may require resistance values which deviate from an integral multiple of the resistance value of the basic resistance but their dimensioning differs only to a comparatively small extent from the basic resistance.

Since the input impedance arrangement of the active electronic filter circuit in accordance with the invention requires a smaller number of circuit elements the parasitic effects caused by these elements are also reduced. Moreover, a more compact structure which saves semiconductor area is obtained.

A extension of the embodiment of the invention shown in FIG. 3 is shown in broken lines in FIG. 3. This extension includes a further T network formed by a first, second, third, fourth and fifth impedance branch 31, 32, 33, 34 and 35, respectively, similarly to the first T network 21 to 25. The terminals 36 and 37 serve as filter inputs of the filter circuit thus extended. The further T network 31 to 35 is cascaded with the first T network 21 to 25.

Preferably, the first, the second, the third and the fourth impedance branch take the form of controllable ohmic elements, preferably MOS transistors. In particular, said elements are controlled pairwise.

In a modification, not shown, the invention can also be applied to asymmetrical filter circuits. A simple example of this is a filter circuit having only one filter input and comprising an amplifier element having only one amplifier input and only one amplifier output. In an implementation as integrator filter such a known filter circuit, in contradistinction to that shown in FIG. 1, may, for example, include only the first ohmic resistance 6 and the first capacitance 10. In an embodiment of the active electronic filter circuit in accordance with the invention having a single filter input, the input impedance arrangement may comprise a first impedance branch between the single filter input and a node, a second impedance branch between this node and the single amplifier input, and a third impedance branch between the node and ground. A part of the signal current applied to the filter input is then drained to ground via the third impedance branch and does not reach the amplifier input.

In a similar way, it is also possible to realize filter circuits having other filter characteristics than integrator filters.

In the case of integrator filters the invention particularly enables the problem of dimensioning large values for the RC time constants with adequate accuracy can be coped with in a simple and effective manner. Thus, it is possible to achieve a higher dimensioning accuracy and a reduced influence of parasitic elements with a smaller number of circuit elements and a reduction of the required semiconductor area.

What is claimed is:

1. An active electronic filter circuit comprising:
   a first and a second filter input,
   an amplifier element having a first and a second amplifier input, and
   a network which defines characteristics of the filter circuit, and which comprises an input impedance arrangement for connecting the filter inputs to the amplifier inputs,
   characterized in that
   the input impedance arrangement comprises
   at least one T network having a first, a second, a third, a fourth, and a fifth impedance branch, the first impedance branch connected to the first filter input and a first node, the second impedance branch connected to the second filter input and a second node, the third impedance branch connected to the first node and the first amplifier input, the fourth impedance branch connected to the second node and the second amplifier input, and the fifth impedance branch connected to the first node and the second node; and the impedance branches are essentially formed by means of ohmic elements.

2. An active electronic filter circuit as claimed in claim 1, characterized in that the input impedance arrangement comprises at least two T networks in cascade.

3. An active electronic filter circuit as claimed in claim 2, characterized in that the T networks are symmetrical with respect to at least one of:
 the filter inputs and
 the amplifier inputs.

4. An active electronic filter circuit as claimed in claim 3, characterized in that at least some of the impedance branches include controllable essentially ohmic elements.

5. An active electronic filter circuit as claimed in claim 4, characterized in that the controllable essentially ohmic elements are arranged symmetrically within each T network.

6. An active electronic filter circuit as claimed in claim 5, characterized in that the network which determines the characteristics of the filter circuit takes the form of an integrating stage.

7. An apparatus in the field of electronic communication, characterized by an active electronic filter circuit as claimed in any one of the preceding claims.

8. An active electronic filter circuit as claimed in claim 1, characterized in that the network which determines the characteristics of the filter circuit takes the form of an integrating stage.

9. An active electronic filter circuit as claimed in claim 1, characterized in that at least some of the impedance branches include controllable essentially ohmic elements.

10. An active electronic filter circuit as claimed in claim 1, characterized in that the T networks are symmetrical with respect to at least one of:
 the filter inputs and
 the amplifier inputs.

* * * * *